United States Patent
Rios et al.

(10) Patent No.: US 7,973,389 B2
(45) Date of Patent: Jul. 5, 2011

(54) ISOLATED TRI-GATE TRANSISTOR FABRICATED ON BULK SUBSTRATE

(75) Inventors: Rafael Rios, Portland, OR (US); Jack Kavalieros, Portland, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/590,562

(22) Filed: Nov. 10, 2009

(65) Prior Publication Data

US 2010/0059821 A1      Mar. 11, 2010

Related U.S. Application Data

(62) Division of application No. 11/779,284, filed on Jul. 18, 2007, now abandoned.

(51) Int. Cl.
H01L 21/02 (2006.01)
H01L 29/06 (2006.01)
H01L 29/41 (2006.01)

(52) U.S. Cl. ........ 257/623; 257/213; 257/401; 257/288; 257/E29.112; 257/E29.005; 257/E21.014

(58) Field of Classification Search ............ 257/623, 257/401, 213, 288, E29.112, E29.005, E21.014
See application file for complete search history.

(56) References Cited

U.S. PATENT DOCUMENTS

| 7,005,700 B2 | 2/2006 | Lee |
| 7,172,943 B2 | 2/2007 | Yeo et al. |
| 7,229,889 B2 | 6/2007 | Holmes et al. |
| 2008/0001234 A1 * | 1/2008 | Cheng et al. ............ 257/370 |

FOREIGN PATENT DOCUMENTS

| WO | 2009/012053 A2 | 1/2009 |
| WO | 2009/012053 A3 | 3/2009 |

OTHER PUBLICATIONS

International Search Report and Written Opinion received for PCT Patent Application No. PCT/US2008/068855, mailed on Dec. 30, 2008, 10 pages.
International Preliminary Report on Patentability received for PCT Patent Application No. PCT/US2008/068855, mailed on Jan. 28, 2010, 6 pages.

* cited by examiner

Primary Examiner — Victor Mandala
(74) Attorney, Agent, or Firm — Rahul D. Engineer

(57) ABSTRACT

A method of forming an isolated tri-gate semiconductor body comprises patterning a bulk substrate to form a fin structure, depositing an insulating material around the fin structure, recessing the insulating material to expose a portion of the fin structure that will be used for the tri-gate semiconductor body, depositing a nitride cap over the exposed portion of the fin structure to protect the exposed portion of the fin structure, and carrying out a thermal oxidation process to oxidize an unprotected portion of the fin structure below the nitride cap. The oxidized portion of the fin isolates the semiconductor body that is being protected by the nitride cap. The nitride cap may then be removed. The thermal oxidation process may comprise annealing the substrate at a temperature between around 900° C. and around 1100° C. for a time duration between around 0.5 hours and around 3 hours.

6 Claims, 9 Drawing Sheets

ISOLATED TRI-GATE TRANSISTOR FABRICATED ON BULK SUBSTRATE

BACKGROUND

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

On bulk silicon substrates, the fabrication process for tri-gate transistors often encounters problems when aligning the bottom of the metal gate electrode with the source and drain extension tips at the bottom of the transistor body (i.e., the "fin"). When the tri-gate transistor is formed on a bulk substrate, proper alignment is needed for optimal gate control and to reduce short-channel effects. For instance, if the source and drain extension tips are deeper than the metal gate electrode, punch-through may occur. Alternately, if the metal gate electrode is deeper than the source and drain extension tips, the result may be an unwanted gate cap parasitic.

Accordingly, there is a need for a tri-gate transistor fabrication process that combines the ease of fabrication provided by bulk substrates with the improved short channel effects provided by silicon-on-insulator substrates.

DETAILED DESCRIPTION

Described herein are systems and methods of fabricating a tri-gate transistor on a bulk semiconductor substrate with improved short channel effects. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention provide a fabrication process for a tri-gate transistor on a bulk semiconductor substrate where the tri-gate transistor is fully isolated, thereby combining the simple tri-gate on bulk process with the better short-channel behavior of tri-gate on silicon-on-insulator. In accordance with an implementation of the invention, a semiconductor body for the tri-gate transistor is formed out of the bulk substrate. This semiconductor body is often referred to as the "fin" of a tri-gate transistor. Next, an oxide layer is fabricated beneath the semiconductor body using an oxidation process. The oxide layer isolates the semiconductor body from the bulk substrate and reduces junction capacitance.

Figure 1:
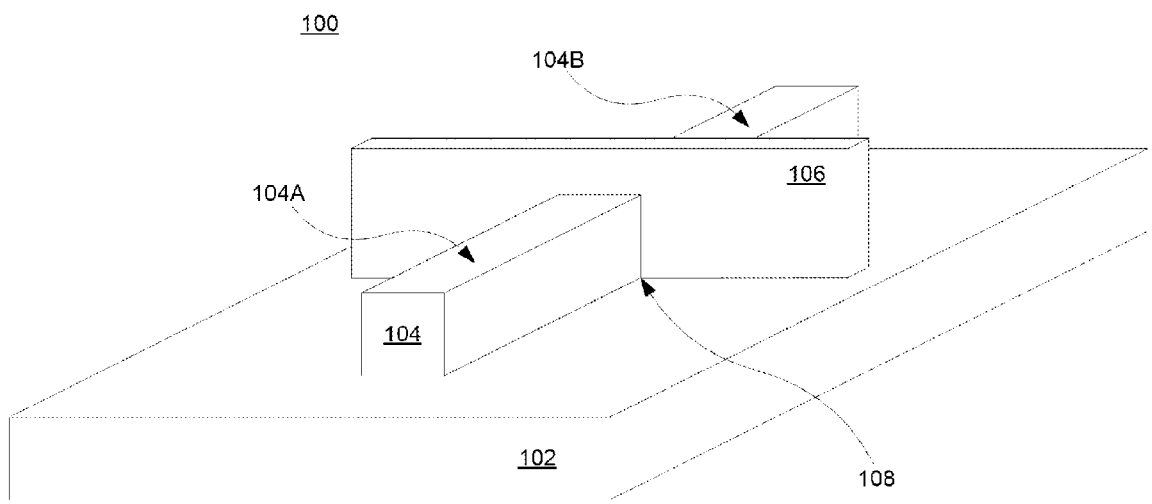
FIG. 1 illustrates a conventional tri-gate device.

For reference, FIG. 1 illustrates a conventional tri-gate transistor 100. As shown, the tri-gate transistor 100 is formed on a bulk semiconductor substrate 102, such as a bulk silicon substrate. The tri-gate transistor 100 includes a semiconductor body 104, also known as the fin structure of the tri-gate transistor 100. The semiconductor body 104 is generally formed from the same material as the bulk substrate 102. The tri-gate transistor 100 also includes a metal gate electrode 106 formed from a conductive material such as polysilicon or a metal. As shown, the metal gate electrode 106 is adjacent to three separate surfaces of the semiconductor body 104, thereby forming three separate gates for the transistor.

A source region 104A and a drain region 104B are formed in the semiconductor body 104 on opposite sides of the metal gate electrode 106. A channel region (not labeled) is formed in the semiconductor body 104 between the source and drain regions 104A/B and below the metal gate electrode 106. As is known in the art, source and drain tip extensions (not shown) may be formed in the channel region. Since the semiconductor body 104 is not isolated from the substrate 102, at interface 108, alignment of the bottom of the tip extensions with the bottom of the metal gate electrode 106 is critical. If the tip extensions penetrate down into the substrate 102, or if the tip extensions do not penetrate to the bottom of the semiconductor body 104, short-channel effect issues may arise.

Figure 2:
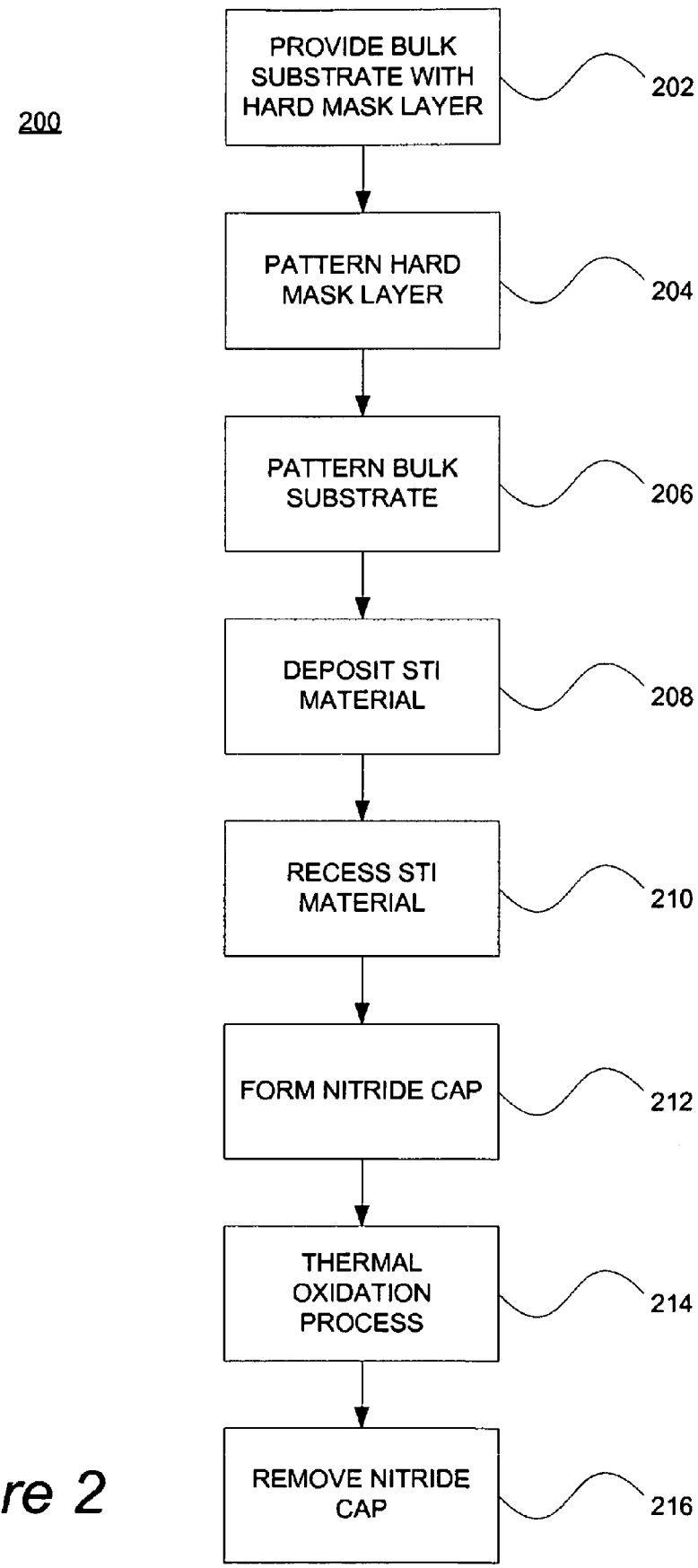
FIG. 2 is a method of forming an isolated semiconductor body in accordance with an implementation of the invention.

FIG. 2 is a method 200 of forming an isolated semiconductor body on a bulk substrate in accordance with an implementation of the invention. FIGS. 3 through 10 illustrate cross-sections of structures that are formed when the method 200 is carried out.

The method 200 begins by providing a bulk substrate upon which the isolated semiconductor body of the invention may be formed (202 of FIG. 2). In implementations of the invention, the bulk substrate may be formed from silicon or a silicon alloy. In further implementations, the bulk substrate may include materials such as germanium, indium antimonide, lead telluride, indium arsenide, indium phosphide, gallium arsenide, or gallium antimonide, any of which may be combined with silicon.

Figure 3:
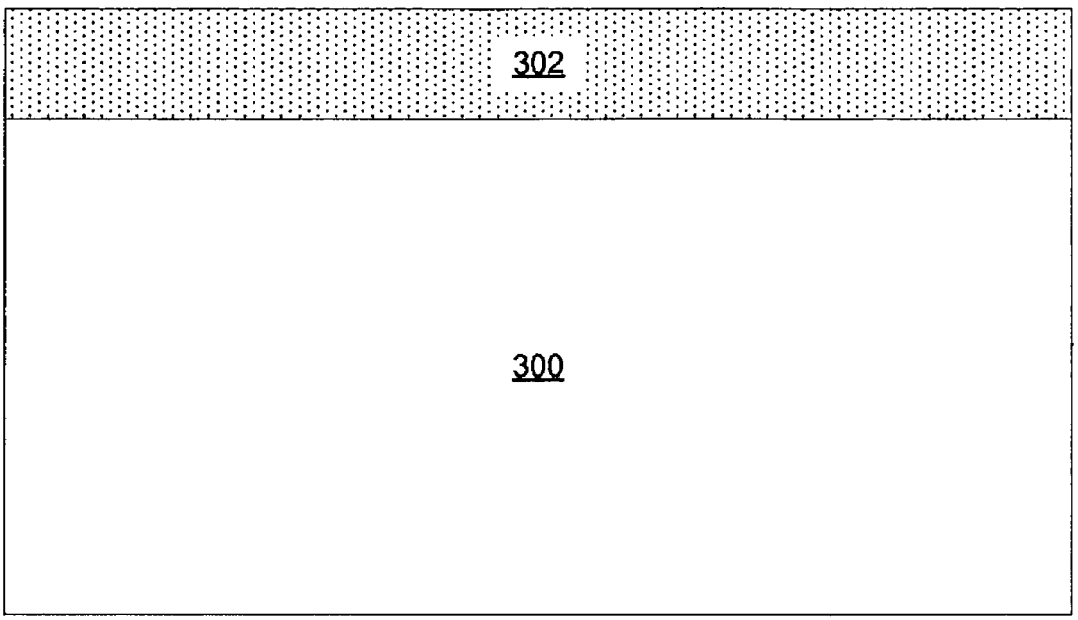
FIGS. 3 to 10 illustrate structures formed when the process of FIG. 2 is carried out.

The bulk substrate includes a hard mask layer formed from a material such as silicon nitride (e.g., $Si_3N_4$). The silicon nitride hard mask layer may be formed using conventional processes, such as a chemical vapor deposition process on a top surface of the silicon bulk substrate. FIG. 3 illustrates a cross-section of a bulk substrate 300 that includes a silicon nitride layer 302 formed on its top surface.

Figure 4:
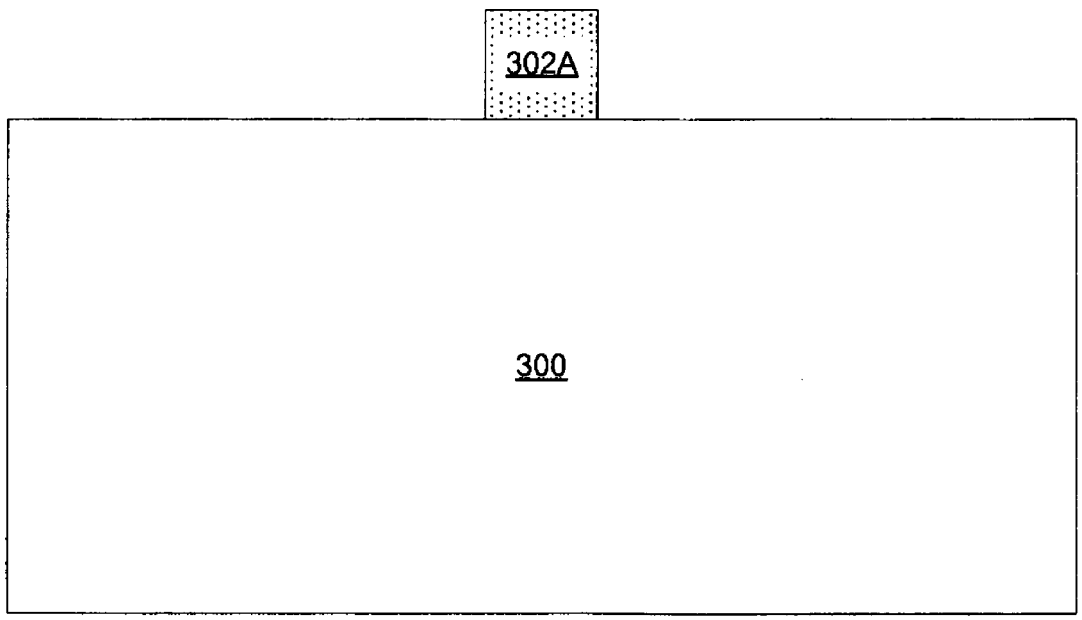
Figure 5:
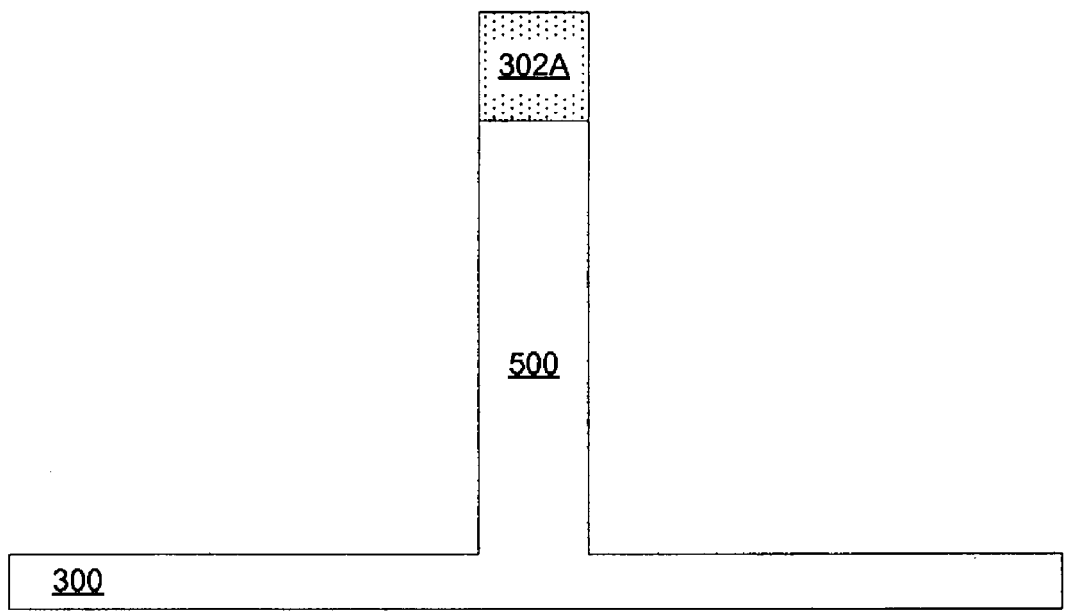

The hard mask layer may be etched to form a patterned hard mask layer (204). Conventional processes known in the art may be used to pattern the hard mask layer, such as conventional lithography processes using a dry etch or a reactive ion etch in plasmas of $CHF_3$, $CH_3F$, or $CF_4$. In further implementations, other wet or dry etching processes may be used. The patterned hard mask layer may then be used as a mask to pattern the bulk substrate to form a fin structure (206). Conventional processes known in the art may be used to pattern the bulk substrate, such as a wet etching process using $NH_4OH$ or a dry etching process using HBrCl. Again, in further implementations, other wet or dry etching processes may be used. This fin structure may be used to form a semiconductor body. FIG. 4 illustrates a cross-section of a patterned hard mask structure 302A on the bulk substrate 300. FIG. 5 illustrates a cross-section of a fin structure 500 that has been formed by etching the bulk substrate 300 using the patterned hard mask structure 302A as a mask.

Figure 6:
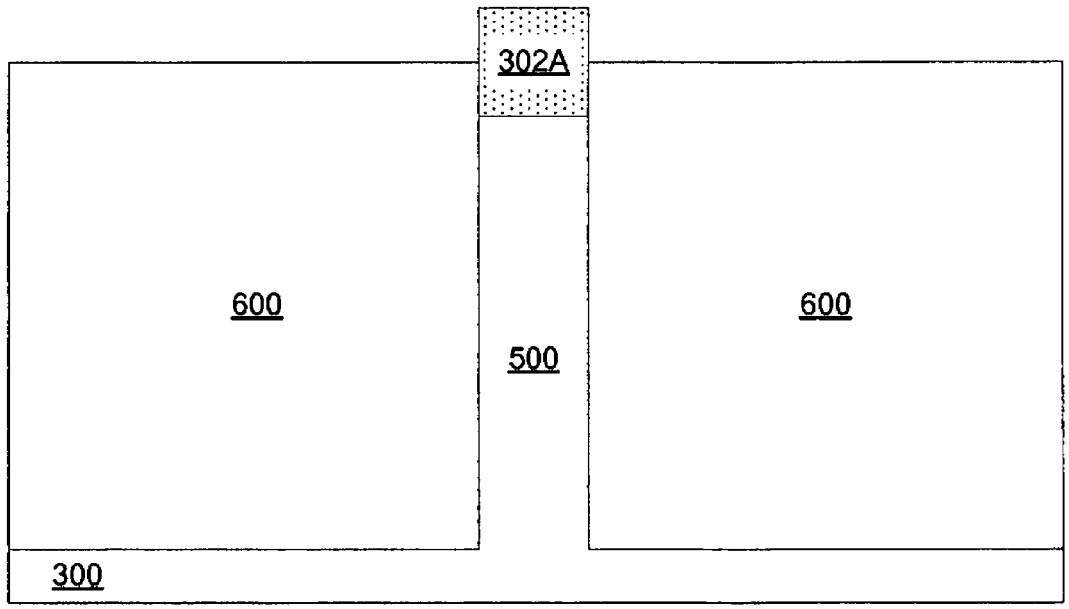

Next, a shallow trench isolation (STI) material is deposited around the fin structure (208). In various implementations of the invention, the STI material may be an insulating material, such as a dielectric material or another oxide material. In some implementations, silicon dioxide or SiOF may be used as the STI material. The STI material may be deposited using conventional deposition processes, such as chemical vapor deposition (CVD), physical vapor deposition (PVD), and atomic layer deposition (ALD). FIG. 6 illustrates a cross-section of an STI material 600 that has been deposited adjacent to the fin structure 500.

Figure 7:
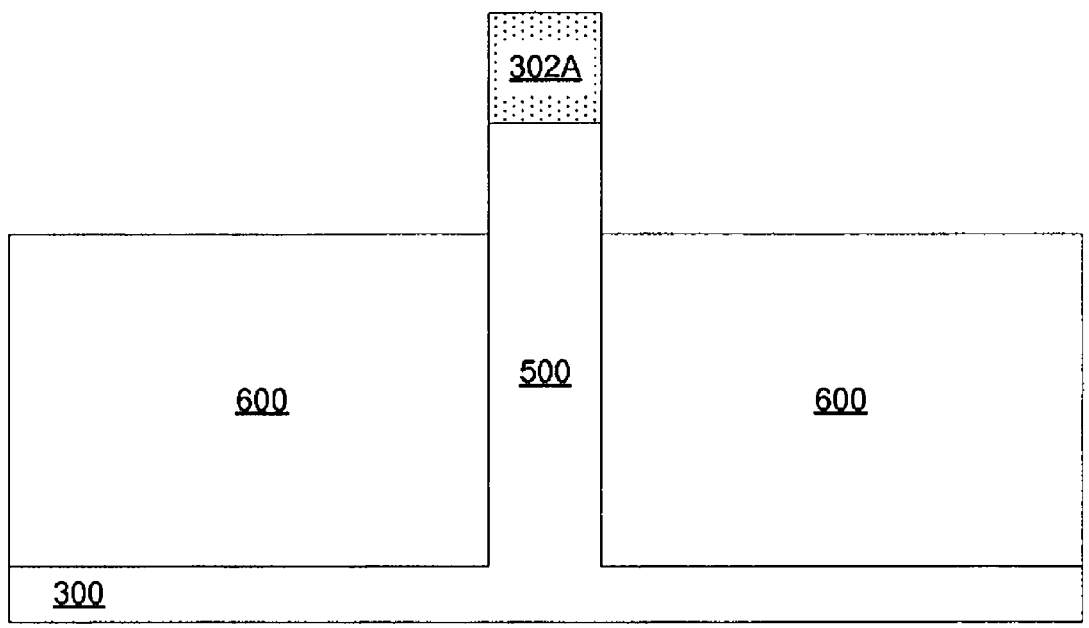

The STI material is then recessed to expose a portion of the fin structure (210). The exposed portion of the fin structure will eventually become an isolated semiconductor body for use in a tri-gate device. Accordingly, the degree or depth to which the STI material is recessed and the fin structure is exposed corresponds to a desired thickness or height of the isolated semiconductor body being formed. Conventional processes may be used to recess or etch the STI material, including but not limited to wet etching processes using hydrogen fluoride (HF) or dry etching processes using $CHF_3$, $CH_3F$, or $CF_4$. In further implementations, other wet or dry etching processes may be used. FIG. 7 illustrates a cross-section of the STI material 600 after it has been recessed, thereby exposing a portion of the fin structure 500.

Figure 8:
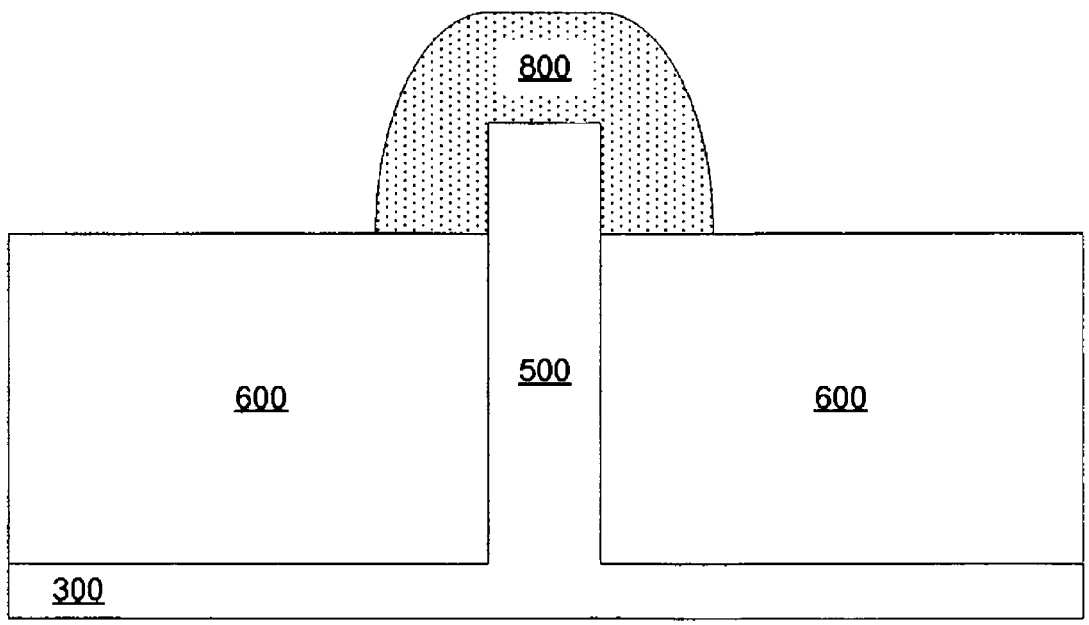

Next, a protective nitride cap is formed over the exposed portion of the fin structure 500 (212). The previously exposed portions of the fin structure are now contained within the nitride cap and protected from oxidation. The nitride cap may be formed of the same material as the hard mask material, such as silicon nitride (e.g., $Si_3N_4$), and may be formed using conventional processes. For instance, a deposition process such as CVD, PVD, or ALD may be used with precursors such as silane and ammonia to form a nitride layer over the STI material and the fin structure. An etching process, such as those described above, may then be used to etch the nitride layer and form a nitride cap over the fin structure. FIG. 8 illustrates a cross-section of a nitride cap 800 formed on the fin structure 500.

In accordance with implementations of the invention, a thermal oxidation process is now carried out to oxidize a portion of the fin structure that is just below but not contained within the nitride cap (214). In other words, the oxidation process consumes an unprotected portion of the silicon fin that is below the bottom edge of the nitride cap, thereby converting the silicon into a silicon oxide material. The portion of the fin structure protected by the nitride cap now becomes isolated from the bulk substrate by this newly formed silicon oxide. In implementations of the invention, the thermal oxidation process may be carried out by annealing the substrate at a temperature between around 900° C. and around 1100° C. for a time duration between around 0.5 hours and around 3 hours or more. The thermal oxidation may take place in an atmosphere that contains one or more of $O_2$, $H_2O$, steam, and HCl.

Figure 9:
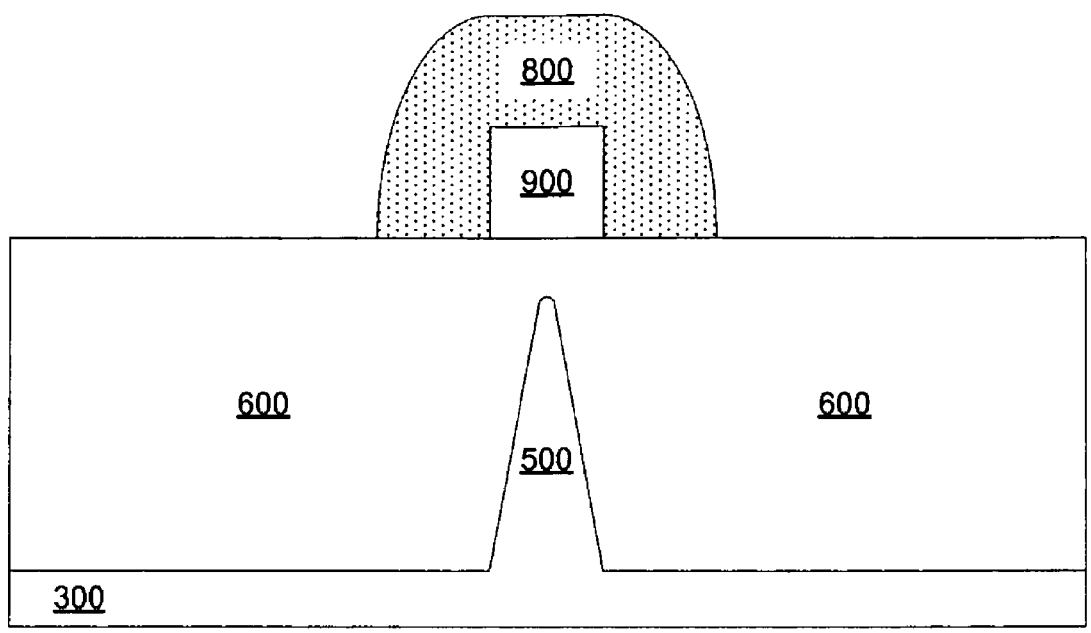

FIG. 9 illustrates a cross-section of the fin structure 500 after a portion of the silicon has been consumed by the thermal oxidation process. As shown, the portion of the fin structure 500 protected by the nitride cap 800 now forms an isolated semiconductor body 900. The material directly below the isolated semiconductor body 900 is an oxide layer, generally a silicon dioxide layer, formed during the thermal oxidation process.

The nitride cap may be removed from the isolated semiconductor body after the thermal oxidation process (216). Conventional processes for removing a nitride from silicon may be used, such as the conventional wet or dry etching processes detailed above. In some implementations, a wet etch process using phosphoric acid may be used since it has a high selectivity to both oxides and silicon. The isolated semiconductor body 900 may now be used to form a tri-gate transistor with improved short-channel effects relative to conventional tri-gate transistors formed on bulk silicon.

Figure 10:
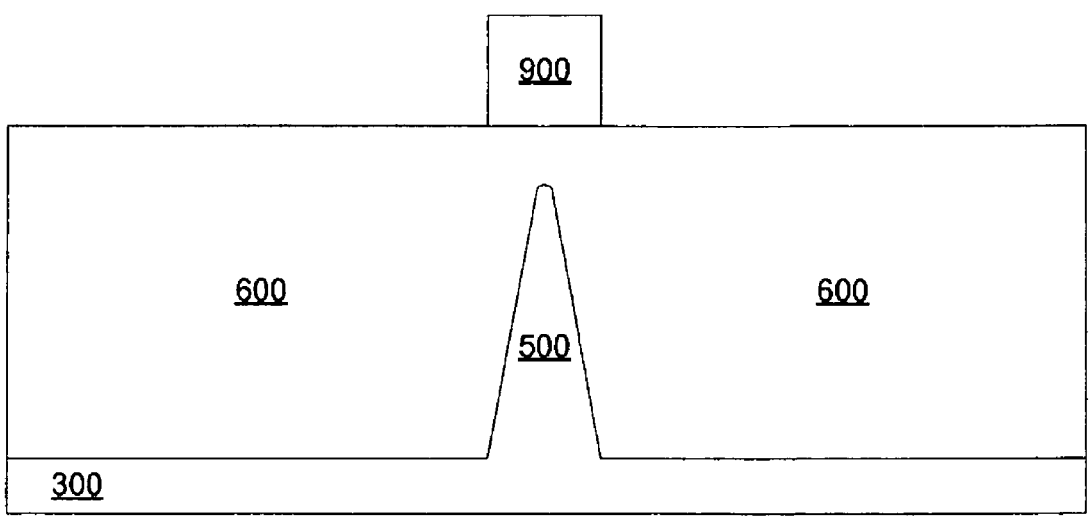

FIG. 10 illustrates isolated semiconductor body 900 after the nitride cap 800 is removed. The semiconductor body 900 is isolated from the bulk substrate 300 and may now be used as a semiconductor body for a tri-gate transistor. Conventional tri-gate fabrication processes may be used from this point forward.

Figure 11:
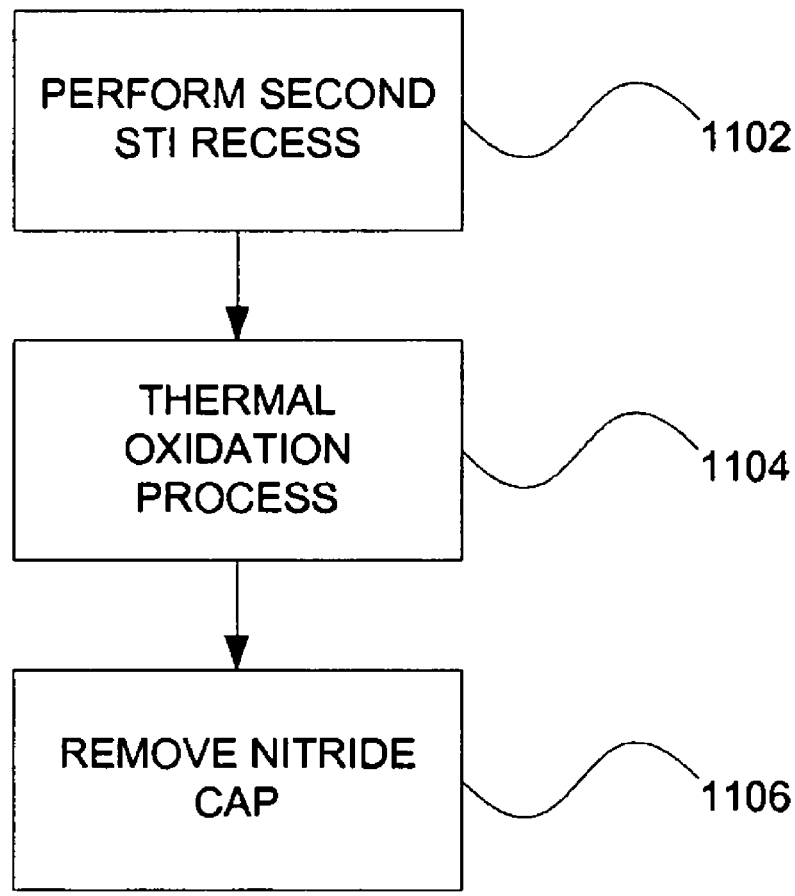
FIG. 11 is a method of forming an isolated semiconductor body in accordance with another implementation of the invention.

FIG. 11 is an alternate method 1100 of forming an isolated semiconductor body in accordance with an implementation of the invention. The method 1100 follows the same process as the method 200 until the nitride cap is formed (i.e., the method 1100 includes the processes 202 through 212 of FIG. 2).

Figure 12:
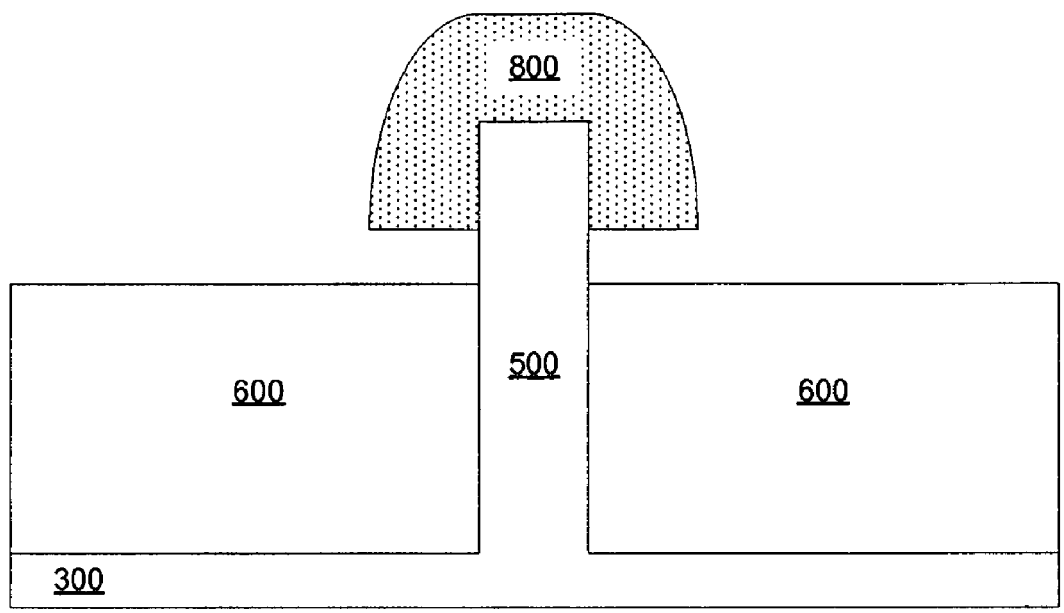
FIGS. 12 to 14 illustrate structures formed when the process of FIG. 11 is carried out.

Once the nitride cap is formed, a second recess of the STI material is performed (1102 of method 1100). In this implementation, the STI material is recessed a second time to expose a portion of the fin structure below the nitride cap that will be converted into an oxide. Accordingly, the degree to which the STI material is recessed here will depend on the desired thickness of oxide layer being formed to isolate the semiconductor body. A wet etch process using hydrofluoric acid or a buffered oxide wet etch may be used to recess the STI material. FIG. 12 illustrates a cross-section of the STI material 600 after it has been recessed second time, thereby exposing a portion of the fin structure 500 below the nitride cap 800.

In accordance with implementations of the invention, a thermal oxidation process is now carried out to oxidize the portion of the fin structure that was exposed during the second STI recess (1104). The oxidation process consumes the silicon that is exposed and not protected by the nitride cap, converting the silicon into a silicon oxide material. Here, the thermal oxidation process has a faster oxidation rate on the silicon because the silicon is exposed, yielding a relatively thinner and better controlled oxide. The portion of the fin structure protected by the nitride cap now becomes isolated from the bulk substrate by this newly formed silicon oxide. As described above, the thermal oxidation process may be carried out by annealing the substrate at a temperature between around 900° C. and around 1100° C. for a time duration between around 0.5 hours and around 3 hours or more. The thermal oxidation may take place in an atmosphere that contains one or more of $O_2$, $H_2O$, steam, and HCl.

Figure 13:
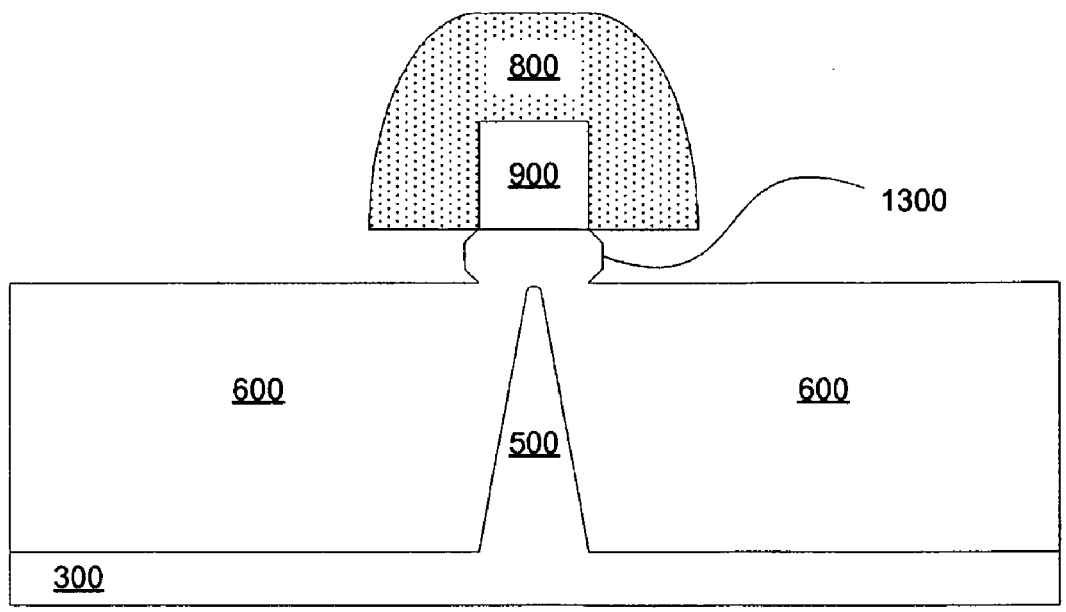

FIG. 13 illustrates a cross-section of the fin structure 500 after the exposed portion of the silicon has been consumed by the thermal oxidation process to form an oxide layer 1300. As shown, the portion of the fin structure 500 protected by the nitride cap 800 now forms an isolated semiconductor body 900. The material directly below the isolated semiconductor body 900 is the oxide layer 1300, generally a silicon dioxide layer, formed during the thermal oxidation process.

Figure 14:
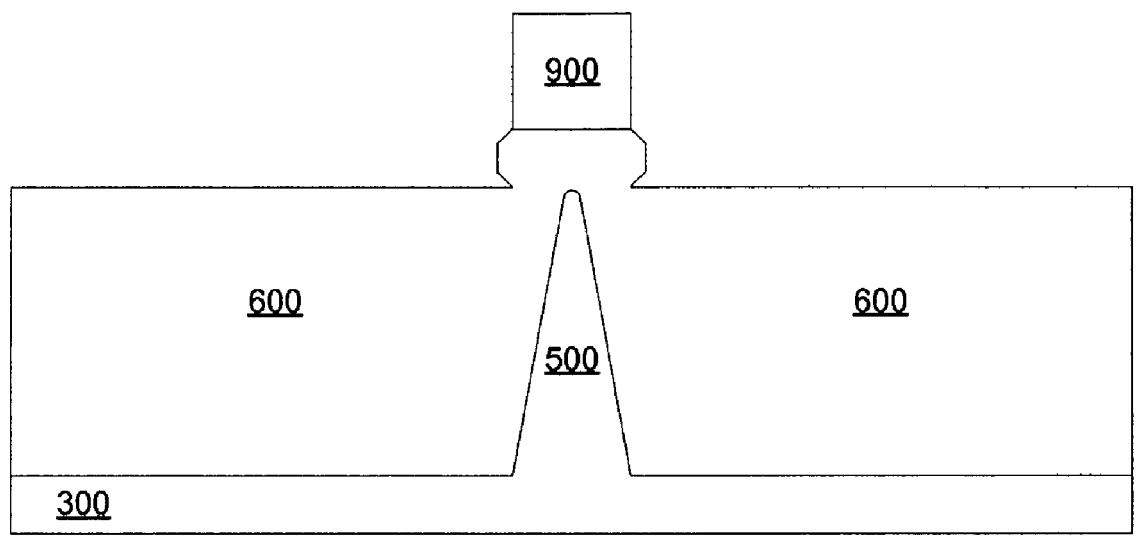

The nitride cap may now be removed from the isolated semiconductor body after the thermal oxidation process (1106). Conventional processes for removing a nitride from silicon may be used, as described above. The isolated semiconductor body 900 may now be used to form a tri-gate transistor with improved short-channel effects relative to conventional tri-gate transistors formed on bulk silicon. FIG. 14 illustrates the isolated semiconductor body 900 after the nitride cap 800 is removed. Once again, conventional tri-gate fabrication processes may be used from this point forward.

Accordingly, methods of forming an isolated semiconductor body on a bulk substrate have been described. In accordance with implementations of the invention, the formation of an oxide layer beneath the semiconductor body provides self alignment of the gate and source/drain tip extensions for optimal gate control. Additional benefits include a simplification of engineering required for the source and drain tip extensions, a reduction of source and drain junction capacitance, and the creation of a relatively thin isolation layer under the active tri-gate device, which provides improved short-channel immunity relative to standard silicon-on-insulator devices that use a relatively thick isolation layer. In addition, the fully isolated semiconductor body of the invention enables other silicon-on-insulator type applications, such as a single device memory with a floating body, even though the starting wafer is bulk silicon.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a bulk substrate;
a fin structure in direct contact with and extending from the bulk substrate;
an oxide layer formed over the fin structure and over the bulk substrate, wherein the oxide layer is in direct contact with both the fin structure and the bulk substrate and wherein a top surface of the oxide layer is substantially planar over both the fin structure and the bulk substrate; and
a semiconductor body formed on the oxide layer proximate to and in alignment with the fin structure, wherein the semiconductor body and the fin structure are both formed from the same material as the bulk substrate and wherein the oxide layer isolates the semiconductor body from the fin structure.

2. The apparatus of claim 1, wherein the material comprises silicon.

3. The apparatus of claim 1, wherein the material comprises silicon alloyed with a second material selected from the group consisting of germanium, indium antimonide, lead telluride, indium arsenide, indium phosphide, gallium arsenide, and gallium antimonide.

4. The apparatus of claim 1, wherein the oxide layer comprises silicon dioxide.

5. An apparatus comprising:
a bulk substrate;
a fin structure in direct contact with and extending from the bulk substrate;
an oxide layer formed atop the fin structure; and
a semiconductor body formed atop the oxide layer, wherein the oxide layer is formed by a thermal oxidation process that consumes a portion of the fin structure.

6. The apparatus of claim 5, wherein the fin structure comprises silicon, the bulk substrate comprises silicon, the semiconductor body comprises silicon, and the oxide layer comprises silicon dioxide.

\* \* \* \* \*